United States Patent [19]

Sewell

[11] Patent Number: 5,060,115

[45] Date of Patent: Oct. 22, 1991

[54] HEAT SINK DEVICE FOR ELECTRONICS MODULES PACKAGED IN CYLINDRICAL CASINGS

[75] Inventor: Mark W. Sewell, Fredericksburg, Va.

[73] Assignee: The United States of America as represented by the Secretary of the Navy, Washington, D.C.

[21] Appl. No.: 590,186

[22] Filed: Sep. 28, 1990

[51] Int. Cl.⁵ .............................................. H05K 7/20
[52] U.S. Cl. .................................. 361/388; 165/185; 361/395
[58] Field of Search ................ 361/382, 383, 386–389, 361/395, 399; 165/80.3, 185; 174/16.3; 357/81; 310/68 D; 363/141

[56] References Cited

U.S. PATENT DOCUMENTS

| | | | |
|---|---|---|---|
| 4,144,932 | 3/1979 | Voigt | 165/80 |
| 4,167,031 | 9/1979 | Patel | 361/388 |
| 4,547,833 | 10/1985 | Sharp | 361/386 |
| 4,638,404 | 1/1987 | Grossmann | 361/388 |
| 4,656,559 | 4/1987 | Fathi | 361/380 |
| 4,682,268 | 7/1987 | Okano et al. | 361/384 |
| 4,695,924 | 9/1987 | Wozniczka | 361/386 |
| 4,701,829 | 10/1987 | Bricaud et al. | 361/386 |
| 4,724,514 | 2/1988 | Kaufman | 361/388 |
| 4,764,845 | 8/1988 | Artus | 361/387 |
| 4,840,222 | 6/1989 | Lakin | 165/185 |
| 4,858,068 | 8/1989 | Bitller | 361/380 |
| 4,962,445 | 10/1990 | Pelet | 361/386 |

Primary Examiner—Gerald P. Tolin
Attorney, Agent, or Firm—John D. Lewis; Kenneth E. Walden

[57] ABSTRACT

A device for dissipating heat from electronics encased in a circular housing is disclosed for uses in buoys, sonobuoys, mines and missiles. The device contains a heat dissipating ring that engages the inner surface of the cylindrical electronics case. The inside surface of this ring is tapered to receive a heat transfer disk that is pulled into tight union with the heat dissipating ring. A heat generating module is mounted in heat transfer union with the disk whereby excess heat is transferred from the disk through the ring to the electronics case where it is dissipated into the environment.

11 Claims, 2 Drawing Sheets

HEAT SINK DEVICE FOR ELECTRONICS MODULES PACKAGED IN CYLINDRICAL CASINGS

BACKGROUND OF THE INVENTION

The invention described herein may be manufactured and used by or for the Government of the United States of America for governmental purposes without the payment of any royalties thereon or therefor.

The present invention relates generally to heat transfer devices and particularly to heat sinks for electronic modules. The invention herein is most specifically oriented towards electronics packaged cylindrically such as is used in sonobuoys, torpedoes, mines, and missiles.

Increasingly, electronics are packaged in cylindrical containers, particularly in the maritime and aerospace arts. The prior art is replete with devices and methods to shunt heat away from electronics components. These devices are oriented towards conventionally cased electronics and are generally not adaptable to cylindrically encased electronics. This problem is exacerbated by the development of higher power, highly miniaturized components. Many prior art heat dissipating structures have been devised that dissipate heat from components to the environment such as is shown in U.S. Pat. No. 4,695,924 to Wozniezka, issued Sept. 22, 1987. Therein a finned sleeve surrounds a heat generating component and transfers heat which is radiantly dissipated in the environment.

U.S. Pat. No. 4,724,514 to Kaufman issued Feb. 21, 1989 teaches a device to transfer heat from the heat generating side of an electronics module to the opposing side which operates as a heat sink to radiantly dissipate heat to the ambient air. Other prior art teachings reveal heat transfer schemes that transfer heat to the electronic housings or have heat dissipation tubes that function as a mounting rack for electronics or electronic modules. An example of this latter configuration is U.S. Pat. No. 4,656,559 issued Apr. 7, 1987 to Fathi.

These prior art devices are designed for conventionally packaged electronics and are not adaptable to high density cylindrically packaged electronic units that lack the internal air quantity and flow for internal cooling. Examples of cylindrical electronics are ubiquitous and include missiles, mines, torpedoes and sonobuoys. Cooling these devices has increasingly become more challenging as power requirements and miniaturization have increased. An effective heat transfer device is particularly needed in buoy and sonobuoy construction, as recent power requirements have escalated.

SUMMARY OF THE INVENTION

The present invention is specifically directed to overcoming the above-enumerated problems in a novel and simple manner.

It is an object of the present invention to teach a heat sink device that can transfer heat directly to the inside wall of a cylindrical electronic housing.

It is a further object to teach a heat sink device for cylindrical electronics that may be easily installed and replaced.

It is still another object of the present invention to teach a heat sink device that optimizes thermal conduction paths with cylindrical electronic housings.

These and other objects are met by the present invention wherein electronics are modularized on circular printed circuit boards and the reverse side of these boards then mate to a thermally conductive heat sink that engages a mounting ring which transfers the heat from the sink to the outside cylindrical housing. The parts are tapered to ensure a tight mechanical fit and fasteners hold the tapered parts in tight contact. One embodiment of this invention includes a slotted mounting ring that expands as the fasteners are tightened, thus more tightly engaging the outside cylindrical housing to ensure maximum heat transfer.

The appended claims set forth the novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which

DETAILED DESCRIPTION OF THE INVENTION

Figure 1:
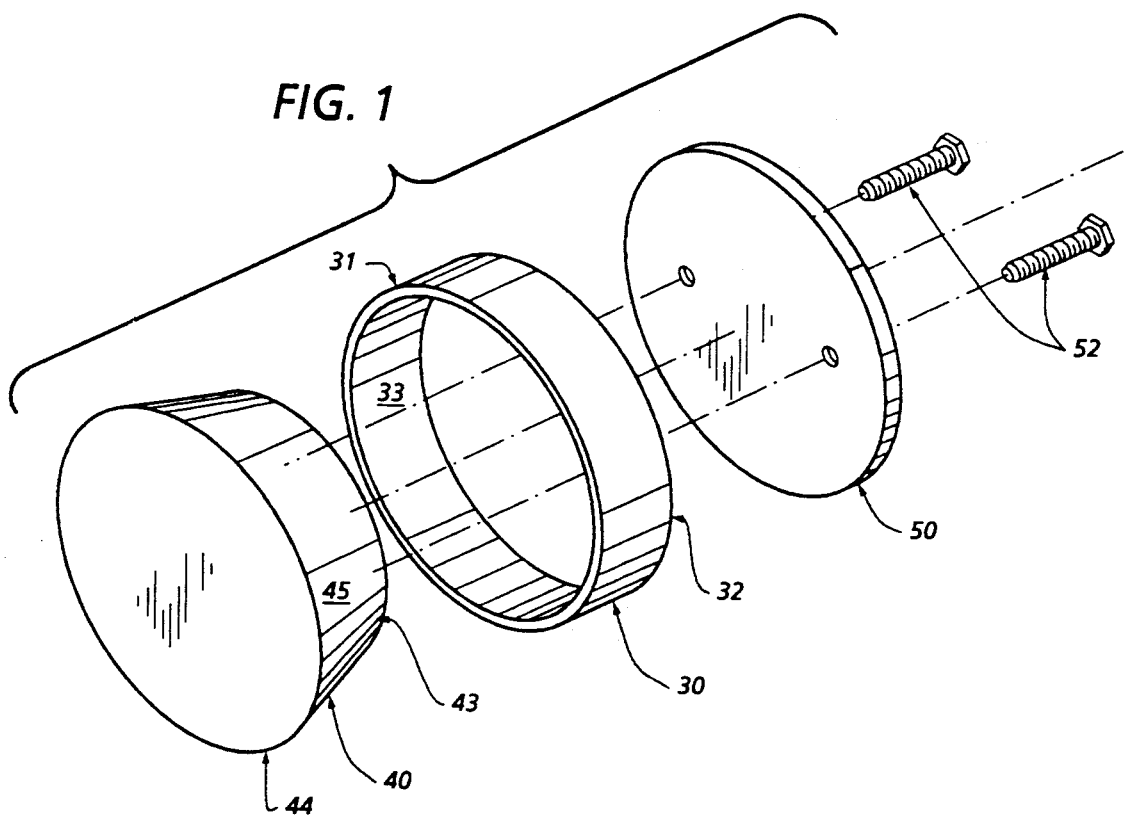
FIG. 1 is an exploded illustration of Applicant's heat sink showing essential elements.

Turning now to FIG. 1, the numeral 10 designates generally Applicant's heat sink device. Therein a thermally conductive ring 30 is shown with the inner surface having a taper so that end 31 is slightly larger in inside diameter than is the diameter of end 32. Ring 30 is formed of a thermally conductive material such as aluminum or copper alloy. Aluminum was employed by Applicant in his prototype models in part because aluminum is easy to machine. It is considered within the scope of Applicant's invention to use any thermally conductive material, such as brass, in manufacturing the conductive components of his device.

Ring 30 is operatively sized with its untapered outside diameter designed to be pressed into cylindrical electronics housings such as a buoy or missile. A heat transfer disk 40 is also constructed of a thermally conductive material and has an outside tapered surface 45 with its diameter on end 43 being smaller than the diameter on end 44. The disk 40 is operative sized to engage the tapered inside surface 33 of thermally conductive ring 30 when assembled. A circular cover plate 50, which may or may not be constructed of thermally conductive material, is machined with an outside diameter substantially the same as the outside diameter of ring 30. It is important to note that cover plate 50 must be large enough to engage ring 30 without slipping inside and must have an outside diameter small enough to fit inside of the electronics housing within which it will be mounted.

Figure 4:
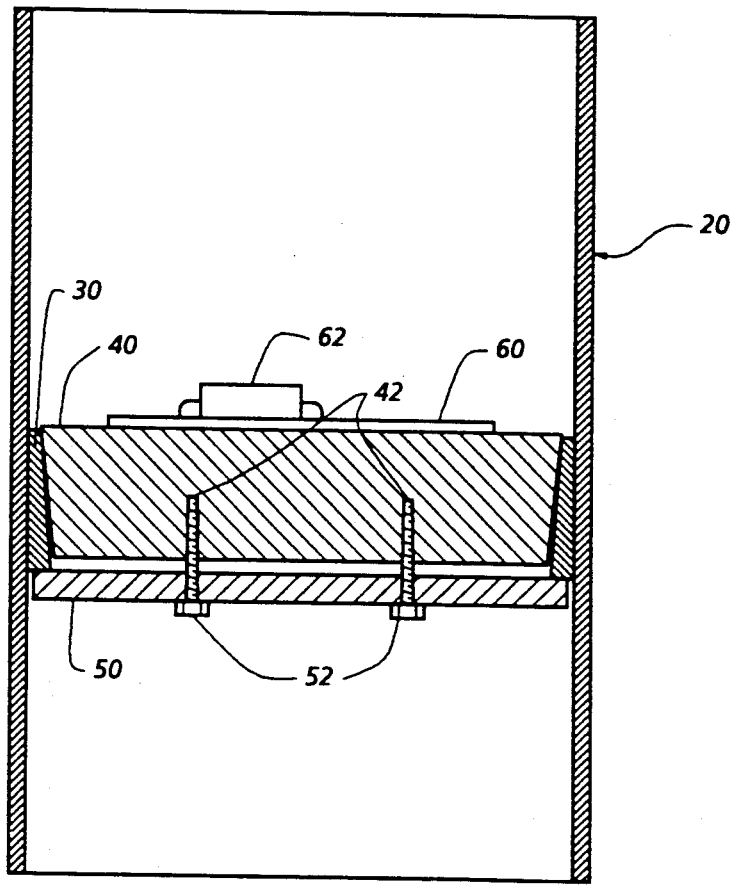
FIG. 4 is an illustration of the heat sink of FIG. 1 in the assembled form.

Cover plate 50 has a plurality of fastener access holes to allow fasteners 52 to extend through and engage the heat transfer disk 40. In the preferred embodiment, machine screws were employed as fasteners and they threadably engaged heat transfer disk 40 by threading into threaded holes 42 as shown in FIG. 4.

As fasteners 52 are tightened, disk 40 is pulled into tight contact within the tapered interior of ring 30 thus providing a heat transfer union between ring 30 and disk 40, so that any heat conducted into disk 40 will conduct through ring 30 to the cylindrical case within which these elements are mounted.

Figure 2:
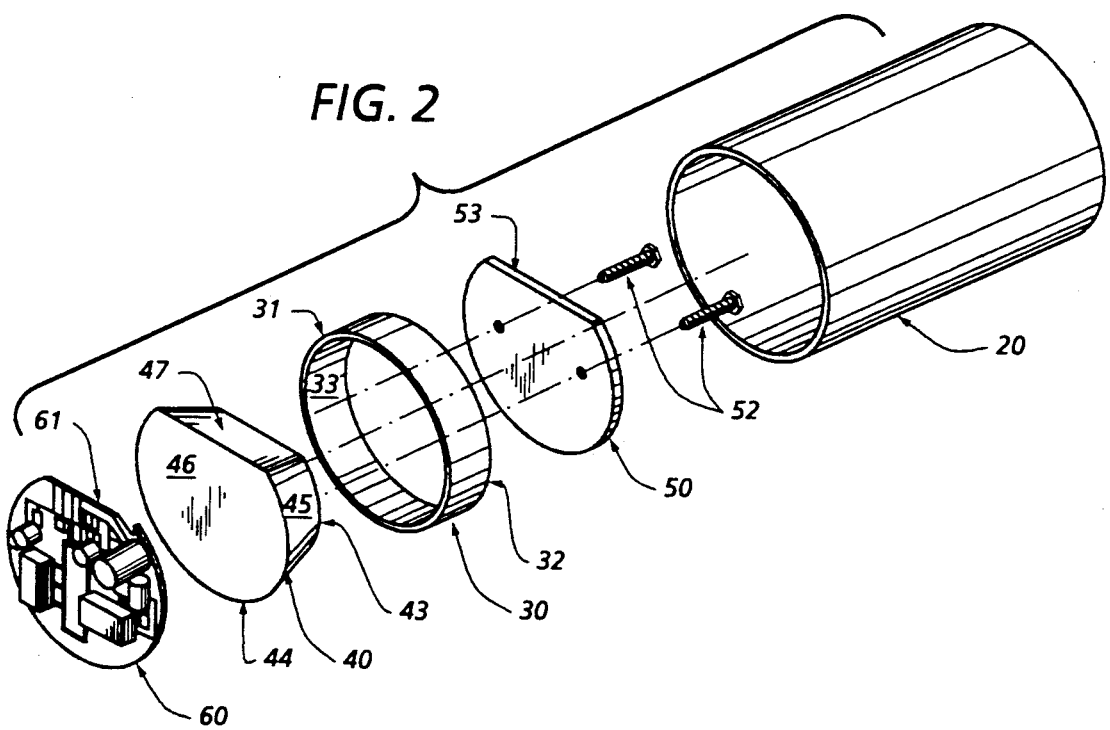
FIG. 2 is an exploded illustration of the heat sink of FIG. 1 shown in relationship with an electronics module and an electronics housing.

Turning now to FIG. 2, a preferred embodiment of Applicant's invention may be more clearly understood in relationship to a cylindrical electronics housing 20. In this embodiment, ring 30 is pressed into position within case 20, thus imparting a conductive fit between the two elements. FIG. 2 also shows a substantially circular electronics module 60 having a planar surface for heat dissipation (not shown), which attaches to planar surface 46 on heat transfer disk 40. The module 60 may be fastened to disk 40 with screws or other fastener means such as a thermally conductive epoxy. The module 60, illustrated in FIG. 2, is not completely circular, but has a truncated side 61 which allows passage of an electronic wiring harness. FIG. 2 also illustrates the heat transfer disk 40 having a truncated outer surface 47 which corresponds to the truncated side on the electronics module, thus allowing an electronic harness to extend through the heat transfer ring and through a like access space 53 in the cover plate. This allows conventional wiring to be employed with Applicant's heat sink device 10.

Figure 3:
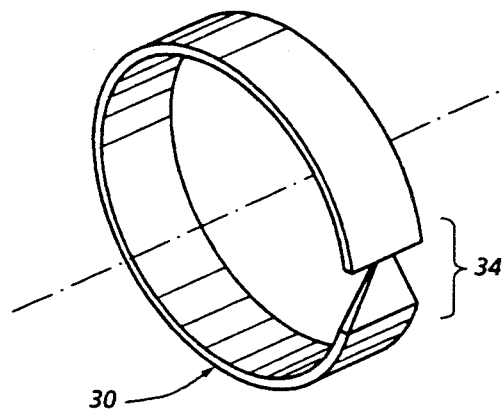
FIG. 3 is an illustration of an embodiment of FIG. 1 having a slotted ring.

A slightly different embodiment of Applicant's invention is illustrated in FIG. 3 wherein a slot 34 is shown machined through heat transfer ring 30. In this embodiment, ring 30 is not pressed into electronics housing 20, but engages electronics housing 20 when device 10 is assembled. In this embodiment, disk 40 urgingly expands ring 30. It is drawn inside by tightening fasteners 52, thus forcing ring 30 in heat transfer union with the inside of electronics case 20.

This slotted embodiment is particularly useful in prototype units where components and element must be disassembled and reassembled.

FIG. 4 shows an assembled cross section of Applicant's heat sink. Therein a heat generating component 62 is shown mounted on a module 60. Module 60 is affixed to heat transfer disk 40 forming a thermally conductive union. Disk 40 is wedged in large surface contact with heat transfer ring 30 which is pressed or expanded against electronics housing 20, thus providing a heat conductive path from component 62 to the electronics housing 20 where excess heat is radiated into the environment.

It is worthy of note that a standard commercially available heat sink compound can be used to coat the surfaces mating to form the conductive path. Applicant used Thermal Compound, Part No. 120-2 which is commercially available from Wakefield Engineering, Inc., Wakefield, Mass. This particular brand was a design choice only and any heat sink compound, of which many are known to those skilled in the art, may be used.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed:

1. A heat sink device for electronics modules packaged in a cylindrical outer case comprising:
    a slotted, heat conducting ring capable of radial expansion within the cylindrical case, wherein said ring is in contact with the cylindrical case;
    a heat transfer disk in wedged position inside said ring wherein said heat transfer disk has a truncated portion on one side whereby a space is formed between the truncated portion of the disk and said slotted ring to allow passage of a wiring harness; and
    an electronics module in heat transfer contact with a planar surface of said heat transfer disk.

2. A heat sink according to claim 1 wherein said slotted ring and said heat transfer disk are comprised of aluminum alloy.

3. A heat sink device according to claim 1 wherein said slotted ring and said heat transfer disk are formed of copper alloy.

4. A heat sink device according to claim 1 wherein said slotted ring and said heat transfer disk are formed of brass.

5. A heat sink device for electronics modules packaged in in a cylindrical case comprising:
    a cylindrical thermally conductive ring having an outer surface pressingly engaging the inner surface of the cylindrical case and an inner surface longitudinally tapered;
    a substantially circular heat transfer disk wedged inside the inner surface of said cylindrical thermally conductive ring, wherein two planar surfaces of said heat transfer disk face in opposite axial directions of the cylindrical case;
    a substantially circular electronics module with heat generating electronic components on a first side and a planar heat dissipating surface on a second side with said second side fixed in heat transfer union to one planar surface of said heat transfer disk; and
    a circular cover plate having an outside diameter substantially the same size as the outside diameter of said thermally conductive ring and containing fastener access holes whereby fasteners extend therethrough and engage said heat transfer disk at its other planar surface and urge said heat transfer disk into pressed engagement with said cylindrical thermally conductive ring.

6. A heat sink according to claim 5, wherein said cylindrical thermally conductive ring has a slot machined axially through the circumference of said ring allowing expansion with said circular heat transfer disk urgingly pressed inside said ring.

7. A heat sink device according to claim 5 wherein said cylindrical thermally conductive ring, said circular heat transfer disk, and said circular cover plate are formed of aluminum alloy.

8. A heat sink device according to claim 5 wherein said substantially circular electronics module is affixed to said heat transfer disk with machine screws.

9. A heat sink apparatus for cooling cylindrically packaged electronics modules comprising:
    a thermally conductive cylindrical housing having an inside and outside surface for containing substantially cylindrical electronic modules;

a cylindrical thermally conductive ring having an inside and outside surface with said outside surface pressingly engaging said inside surface of said thermally conductive cylindrical housing whereby heat is transferred from said cylindrical thermally conductive ring to said thermally conductive cylindrical housing and said inside surface of said cylindrical thermally conductive ring is longitudinally tapered along its axis;

a circular heat transfer disk having a first and second planar sides and an outside circumference axially tapered and frictionally engaging said inside tapered surface of said cylindrical thermally conductive ring;

a cylindrical cover plate having an outside diameter substantially equal to the outside surface of said cylindrical thermally conductive ring and containing a plurality of fastener access holes extending therethrough;

a plurality of fastener means extending through said fastener access holes to engage said first planar side of said circular transfer disk, thereby pulling said transfer disk into pressed cooperation with said thermally conductive ring; and a substantially cylindrical electronics module having a first and second planar side whereby said first planar side contains electronics components and said second planar side is conductively affixed to said second planar side of said circular transfer disk.

10. A heat sink according to claim 9 wherein said cylindrical thermally conductive ring is slotted to allow expansion of said ring against the inside surface of said thermally conductive cylindrical housing.

11. A heat sink device according to claim 5 wherein said circular heat transfer disk, said substantially circular electronics module, and said cover plate are all truncated forming a flattened side whereby a wiring harness can pass unimposed when said elements are assembled.

* * * * *